(12) United States Patent
Mizuno

(10) Patent No.: US 11,087,958 B2
(45) Date of Patent: Aug. 10, 2021

(54) RESTORATION METHOD FOR PLASMA PROCESSING APPARATUS

(71) Applicant: TOSHIBA MEMORY CORPORATION, Minato-ku (JP)

(72) Inventor: Hiroyuki Mizuno, Kuwana (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 51 days.

(21) Appl. No.: 16/260,610

(22) Filed: Jan. 29, 2019

(65) Prior Publication Data
US 2019/0385818 A1    Dec. 19, 2019

(30) Foreign Application Priority Data

Jun. 15, 2018   (JP) .............................. JP2018-114256

(51) Int. Cl.
| | | |
|---|---|---|
| C23C 16/44 | (2006.01) | |
| H01J 37/32 | (2006.01) | |
| C04B 41/89 | (2006.01) | |
| C04B 41/52 | (2006.01) | |

(52) U.S. Cl.
CPC ........ *H01J 37/32091* (2013.01); *C04B 41/52* (2013.01); *C04B 41/89* (2013.01); *C23C 16/44* (2013.01); *H01J 37/32541* (2013.01)

(58) Field of Classification Search
CPC ......... C23C 16/44; C23C 16/52; C04B 41/52; C04B 41/89; H01J 37/32091; H01J 37/32541
See application file for complete search history.

(56) References Cited

U.S. PATENT DOCUMENTS

| 4,649,858 A | * | 3/1987 | Sakai ................... F27D 1/1668 |
|---|---|---|---|
| | | | 118/308 |
| 6,099,697 A | * | 8/2000 | Hausmann .......... H01L 21/6831 |
| | | | 204/192.12 |
| 2003/0021901 A1 | | 1/2003 | Gasse |
| | | | (Continued) |

FOREIGN PATENT DOCUMENTS

| JP | 2003-527294 | | 9/2003 |
|---|---|---|---|
| JP | 2010-62579 | * | 3/2010 |

(Continued)

OTHER PUBLICATIONS

Marinov, Daniil, et al., "Reactive plasma cleaning and restoration of transition metal dichalcogenide monolayers". Nature Partner Journals: 2D Materials and Applications (2021) 17, pp. 1-10.*

(Continued)

*Primary Examiner* — Bret P Chen
(74) *Attorney, Agent, or Firm* — Oblon, McClelland, Maier & Neustadt, L.L.P.

(57) ABSTRACT

According to one embodiment, a restoration method for a plasma processing apparatus is provided. The method includes performing application of a restoration liquid from a coating part onto a consumed region on a component for serving as a constituent element of the plasma processing apparatus, by controlling positions of the component and the coating part, and an application amount of the restoration liquid; and solidifying the restoration liquid applied on the component.

5 Claims, 8 Drawing Sheets

(56) References Cited

U.S. PATENT DOCUMENTS

| | | | | |
|---|---|---|---|---|
| 2004/0081746 A1* | 4/2004 | Imafuku | ................... | C23C 4/04 427/2.3 |
| 2004/0224504 A1* | 11/2004 | Gadgil | ................ | H01L 21/7684 438/680 |
| 2005/0189068 A1* | 9/2005 | Suzuki | ............. | H01J 37/32642 156/345.3 |
| 2005/0239365 A1* | 10/2005 | Hiraoka | ................... | H01J 9/50 445/61 |
| 2006/0208650 A1* | 9/2006 | Kondou | ............ | H01J 37/32009 315/111.21 |
| 2007/0141740 A1* | 6/2007 | Theodore | .......... | H01L 21/76254 438/40 |
| 2008/0206452 A1* | 8/2008 | Suzuki | ............. | H01L 21/67069 427/140 |
| 2009/0017563 A1* | 1/2009 | Jiang | ................... | H01L 21/3105 438/4 |
| 2015/0021294 A1* | 1/2015 | Togami | ............. | H01J 37/32963 216/60 |
| 2015/0168130 A1* | 6/2015 | Matsudo | .............. | G01B 9/0209 156/345.24 |
| 2016/0104648 A1* | 4/2016 | Park | ...................... | C23C 16/505 438/9 |
| 2017/0044901 A1* | 2/2017 | Bacos | ....................... | C23C 4/11 |
| 2017/0213753 A1 | 7/2017 | Rogers | | |
| 2017/0260647 A1* | 9/2017 | Ujihara | ................. | C30B 19/068 |
| 2019/0185999 A1* | 6/2019 | Shanbhag | ............. | C23C 16/401 |

FOREIGN PATENT DOCUMENTS

| | | |
|---|---|---|
| JP | 2010-150605 | 7/2010 |
| JP | 2017-130659 | 7/2017 |

OTHER PUBLICATIONS

Horikoshi, S., et al., "In-liquid plasma: a novel tool in the fabrication of nanomaterials and in the treatment of wastewaters". RSC Advances, 2017, 7, 47196-47218.*

* cited by examiner

RESTORATION METHOD FOR PLASMA PROCESSING APPARATUS

CROSS-REFERENCE TO RELATED APPLICATIONS

This application is based upon and claims the benefit of priority from Japanese Patent Application No. 2018-114256, filed on Jun. 15, 2018; the entire contents of which are incorporated herein by reference.

FIELD

Embodiments described herein relate generally to a restoration apparatus and a restoration method for a plasma processing apparatus.

BACKGROUND

Conventionally, a technique is known which coats the ceramic surface with a layer containing SiC.

In a plasma processing apparatus, since plasma is generated above a support member to perform an etching process, etching comes to be applied not only to a wafer but also to a component, such as an edge ring, around the wafer. Thus, there is a demand for a technique for performing restoration of the etched component easily.

DETAILED DESCRIPTION

According to one embodiment, a restoration apparatus for a plasma processing apparatus includes a coating part, a solidifying part, and a controller. The coating part is configured to apply a restoration liquid onto a consumed region on a component serving as a constituent element of the plasma processing apparatus. The solidifying part is configured to solidify the restoration liquid applied on the component. The controller is configured to control application of the restoration liquid from the coating part onto the consumed region on the component.

Exemplary embodiments of a restoration apparatus and a restoration method for a plasma processing apparatus will be explained below in detail with reference to the accompanying drawings. The present invention is not limited to the following embodiments.

First Embodiment

Figure 1:
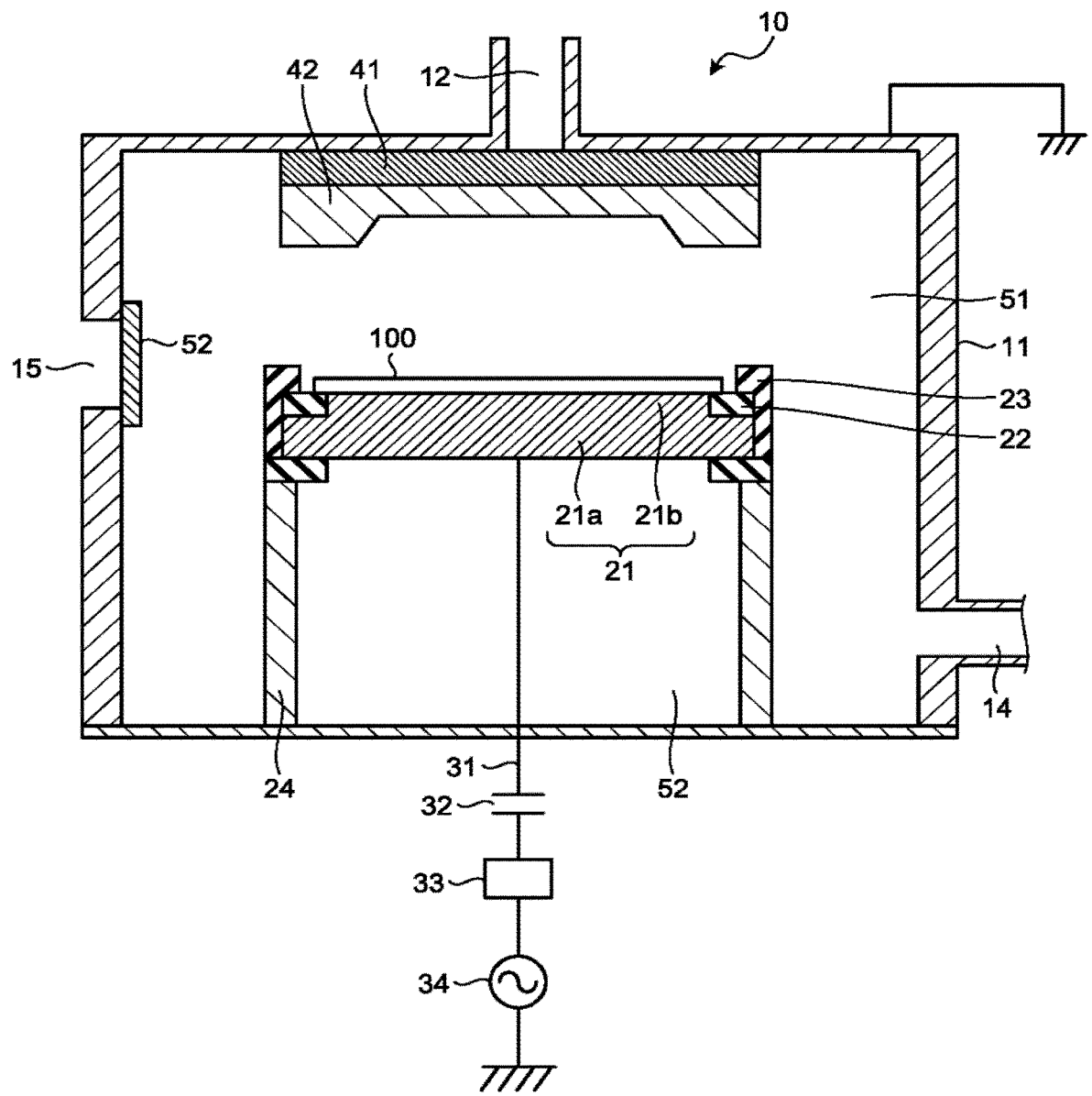
FIG. 1 is a sectional view schematically illustrating a configuration example of a plasma processing apparatus.

FIG. 1 is a sectional view schematically illustrating a configuration example of a plasma processing apparatus. Here, the plasma processing apparatus is exemplified by a Reactive Ion Etching (RIE) apparatus, which is an example of a dry etching apparatus. The plasma processing apparatus 10 includes a chamber 11 made of, e.g., aluminum and structured airtight. This chamber 11 is grounded.

The chamber 11 is provided with a support table 21 inside, which is configured to support an object substrate 100 to be treated as a processing object in a horizontal state, and to function as a lower electrode. The support table 21 is equipped with a holding mechanism (not illustrated) on its surface, such as an electrostatic chuck mechanism for attracting and holding the object substrate 100 by an electrostatic force. The support table 21 has a shape formed of two circular columns, which are different in diameter and stacked up and down. Specifically, the support table 21 has a structure integrally formed of a larger-diameter portion 21a having a first diameter and a smaller-diameter portion 21b having a second diameter smaller than the first diameter. The smaller-diameter portion 21b is arranged on the upper side, and the upper surface of the smaller-diameter portion 21b serves as a mounting surface for the object substrate 100. Here, the mounting surface for the object substrate 100 has a circular shape smaller than the area of the object substrate 100 to be placed on the support table 21. On the other hand, the upper surface of the larger-diameter portion 21a serves as a mounting surface for an edge ring 22.

The edge ring 22 is disposed on the upper surface of the larger-diameter portion 21a of the support table 21. The height of the smaller-diameter portion 21b has been adjusted so that the upper surface of the support table 21 and the upper surface of the edge ring 22 can be almost flush with each other. The edge ring 22 is a member provided to adjust an electric field, during etching to the object substrate 100, such that the electric field is not deflected in the vertical direction (the direction perpendicular to the plane of the object substrate 100) at the peripheral portion of the object substrate 100. The edge ring 22 is made of an insulating material, such as SiC. Further, an insulator ring 23 made of an insulating material, such as quartz, is provided, such that the insulator ring 23 covers the side surface of the support table 21 with the edge ring 22 mounted thereon, and the peripheral portion of the upper surface of the edge ring 22.

Further, the support table 21 is secured by a support frame 24 in a state positioned at about the center inside the chamber 11. The support table 21 is connected to a feeder line 31 for supplying a radio frequency power, and this feeder line 31 is connected to a blocking capacitor 32, a matching device 33, and a radio frequency power supply 34. The radio frequency power supply 34 is configured to supply a radio frequency power having a predetermined frequency to the support table 21.

An upper electrode 42 is provided above the support table 21, and faces the support table 21 functioning as the lower electrode. The upper electrode 42 is secured by a member 41, which is provided near the upper side of the chamber 11 and separated from the support table 21 by a predetermined distance, such that the upper electrode 42 and the support table 21 face each other in parallel. With this structure, the upper electrode 42 and the support table 21 constitute a pair of parallel-plate electrodes. Further, the upper electrode 42 includes a plurality of gas supply passages (not illustrated) formed therein and penetrating the upper electrode 42 in the thickness direction. The upper electrode 42 has a circular plate shape, for example. The upper electrode 42 is an electrode made of silicon, for example.

The chamber 11 is provided with a gas supply port 12 above the arrangement position of the upper electrode 42, to supply a processing gas for use in a plasma process. The gas supply port 12 is connected to a gas supply unit (not illustrated) through a pipe.

The chamber 11 is provided with a gas exhaust port 14 on the lower side. The gas exhaust port 14 is connected to a vacuum pump (not illustrated) through a pipe.

The chamber 11 is provided with an opening 15 on a side surface, through which, for example, the object substrate 100 is loaded or unloaded, and the opening 15 is provided with a shutter 52. The shutter 52 serves to separate the outside and inside of the chamber 11 from each other, and can be opened to connect the opening 15 to the inside of the chamber 11 when the object substrate 100 is to be loaded or unloaded.

Figure 2:
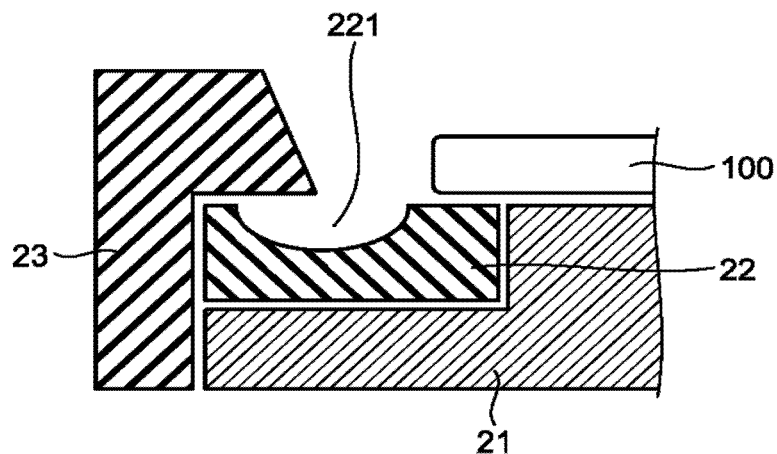
FIG. 2 is a partial sectional view schematically illustrating the state of an edge ring in a plasma process.

Next, an explanation will be given of an outline of a process in the plasma processing apparatus 10 configured as described above. FIG. 2 is a partial sectional view schematically illustrating the state of the edge ring in a plasma process. First, an object substrate 100 to be treated as a processing object is placed on the support table 21, and is fixed by the electrostatic chuck mechanism, for example. Then, the inside of the chamber 11 is vacuum-exhausted by the vacuum pump (not illustrated) connected to the gas exhaust port 14.

Thereafter, when the inside of the chamber 11 reaches a predetermined pressure, a process gas is supplied from the gas supply unit (not illustrated), through the gas delivery ports of the upper electrode 42, into the space between the upper electrode 42 and the support table 21. Then, in a state where the upper electrode 42 is grounded, a radio frequency voltage is applied to the support table 21 (lower electrode), so that plasma is generated in the space between the upper electrode 42 and the support table. Here, a potential gradient is generated between the plasma and the object substrate 100, on the lower electrode side, due to a self bias caused by the radio frequency voltage. Consequently, ions in the plasma gas are accelerated toward the support table 21, and an anisotropic etching process is thereby performed.

At this time, not only the object substrate 100 but also the edge ring 22 present around are etched. As the edge ring 22 is kept used for a long time, that part of the upper surface of the edge ring 22, which is exposed to plasma, is etched and thereby damaged, as illustrated in FIG. 2. Consequently, a recessed region 221 is formed at the damaged place, as illustrated in FIG. 2. As compared with plasma process characteristics acquired when the edge ring 22 is used in the brand new state, the plasma process characteristics are deteriorated when the edge ring 22 is used in a damaged state. In consideration of this, in this embodiment, an explanation will be given of a method for performing restoration and reuse of a component, such as the edge ring 22, damaged by a plasma process.

Figure 3A:
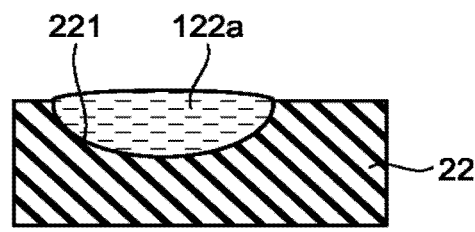
FIGS. 3A and 3B are diagrams for explaining an outline of a restoration method for a plasma processing apparatus, according to a first embodiment.
Figure 3B:
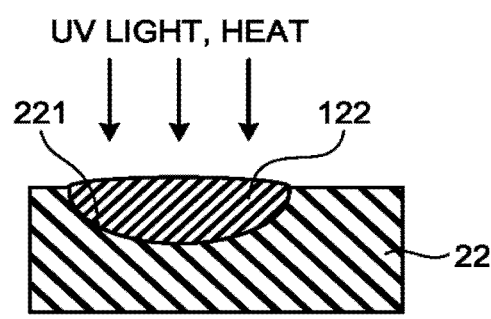

FIGS. 3A and 3B are diagrams for explaining an outline of a restoration method for a plasma processing apparatus, according to the first embodiment. In the first embodiment, when restoration is performed to a component for use in the plasma processing apparatus 10, a restoration liquid is used, which contains an ingredient to be turned into an inorganic film by crosslinking or polymerization. As this restoration liquid, liquid SiC or Spin On Glass (SOG) solution may be used.

The liquid SiC is a mixed solution of a silicon-containing material that contains silicon, with a carbon-containing material in a liquid state that contains carbon. The liquid SiC is a material that is turned into an SiC film by crosslinking or polymerization. The silicon-containing material is made of at least one species selected from the group consisting of cyclopentasilane, cyclohexasilane, neo-pentasilane, and polyhydrosilane.

The carbon-containing material is in a liquid state at room temperature and atmospheric pressure (for example, 25° C., 1,013 hPa), and is made of at least one species selected from the group consisting of a cyclic hydrocarbon compound expressed by general formula of $C_nH_{2n-2}$ or $C_nH_{2n-4}$ where "n" is 5 or more, and a chain hydrocarbon compound expressed by general formula $C_nH_{2n}$ or $C_nH_{2n-2}$ where "n" is 5 or more. Further, for the carbon-containing material, some of the hydrogen atoms in the cyclic hydrocarbon compound or chain hydrocarbon compound described above may be replaced with a well known substituent. For example, the carbon-containing material is made of at least one species selected from the group consisting of cyclohexene, 1-hexyne, 2-hexyne, 3-hexyne, cyclopenten, cyclooctene, 1,3-cyclopentadiene, 1,3-cyclohexadiene, 1,4-cyclohexadiene, 1-hexene, 2-hexene, 3-hexene, 1,3-hexadiene, 1,4-hexadiene, and 1,5-hexadiene.

The SOG solution is a material that is turned into an $SiO_2$ film in a glassy state by crosslinking or polymerization. For example, the SOG solution may be exemplified by polysilazane-based SOG, silicate-based SOG, alkoxysilicate-based SOG, and/or the like.

Hereinafter, a case will be taken as an example where the liquid SiC is used as the restoration liquid. As illustrated in FIG. 3A, the liquid SiC 122a is applied onto the edge ring 22 that is a damaged component. For example, as explained with reference to FIG. 2, when the recessed region 221 has been formed in the edge ring 22 due to a plasma process, the liquid SiC 122a is applied to fill up the recessed region 221.

Then, as illustrated in FIG. 3B, the liquid SiC 122a is subjected to heat application or light irradiation. Consequently, the liquid SiC 122a is dehydrogenated, and an SiC film 122 is thereby formed in the recessed region 221. In the case of the SiC film 122 thus formed, since there is no need to use any metal catalyst, metal contamination is prevented from occurring. As a result, it is possible to acquire SiC under high purity physicality control. In this way, the damaged component is restored. As SiC is a substance high in hardness, resistant to heat, and stable in chemistry, the component thus restored can be used again for the plasma processing apparatus 10.

Figure 4:
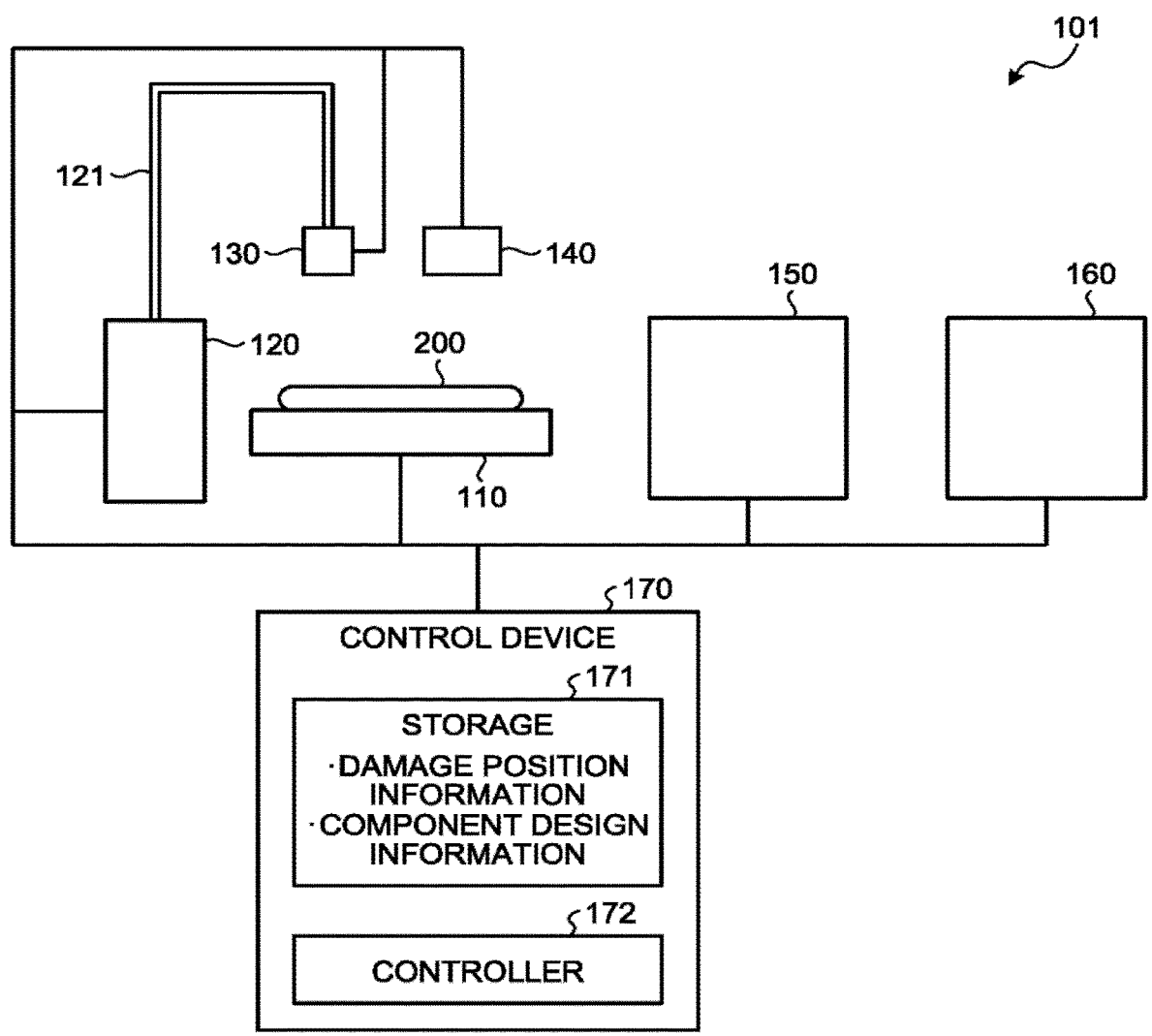
FIG. 4 is a diagram schematically illustrating a configuration example of a restoration apparatus for a plasma processing apparatus, according to the first embodiment.

FIG. 4 is a diagram schematically illustrating a configuration example of a restoration apparatus for a plasma processing apparatus, according to the first embodiment. The restoration apparatus 101 includes a stage 110, a restoration liquid storage part 120, a coating part 130, a solidifying part 140, an additional processing section 150, a cleaning section 160, and a control device 170.

The stage 110 is configured to place thereon a component 200 to be treated as a processing object. The component 200 is a component for serving as a constituent element of the plasma processing apparatus 10, such as the edge ring 22 or insulator ring 23. The component is a component damaged by plasma because of use for a predetermined time in the plasma processing apparatus 10.

The restoration liquid storage part 120 stores a restoration liquid. The coating part 130 is configured to apply the restoration liquid onto the component 200. The coating part 130 is formed of a nozzle, for example. The coating part 130 is connected to the restoration liquid storage part 120 by a pipe 121. In accordance with an instruction from the control device 170, the coating part 130 applies the restoration liquid from the restoration liquid storage part 120 onto a consumed region on the component 200. The stage 110 and the coating part 130 are configured to change relative positions therebetween as required.

The solidifying part 140 is configured to solidify the restoration liquid applied on the component 200, by using heat or light. For example, the solidifying part 140 is formed of a heater, or a light source for emitting light having a wavelength that can solidify the restoration liquid. Hereinafter, the restoration liquid solidified by heat or light on the component 200 will be referred to as "restored portion".

The additional processing section 150 is arranged to perform processing to the component 200 including a restored portion formed thereon, to make the component 200 into a shape the same as that of the component 200 in the brand new state. This is because the restored portion solidified on the component 200 does not necessarily have a desired shape. The additional processing section 150 performs processing to the component 200 including the restored portion formed thereon, in accordance with the design drawings or dimension drawings of the component 200. As the additional processing, for example, cutting, polishing, and/or the like are performed. The additional processing section 150 is formed of a lathe turning machine or machining center, for example. The cleaning section 160 is arranged to perform cleaning to the component 200 subjected to the additional processing.

The control device 170 is configured to control the restoration apparatus 101 as a whole. For example, the control device 170 moves the stage 110 and the coating part 130 relative to each other, controls the amount of restoration liquid to be delivered from the coating part 130, controls the operation of the solidifying part 140, and so forth. Further, the control device 170 controls the additional processing in the additional processing section 150, and the cleaning in the cleaning section 160.

The control device 170 includes a storage 171 and a controller 172. The storage 171 stores damage position information that indicates a damage position on each component 200, and component design information that shows the shape of each component in the brand new state. For example, the damage position information is information that indicates a position to be damaged on each component 200 in the plasma processing apparatus 10. For example, as illustrated in FIG. 2, the damage position on the edge ring 22 is almost constant. Accordingly, in such a case, information about this damage position is registered in advance in the storage 171. The component design information is design information that shows the size, angle, bending degree, and so forth of each component 200. The component design information is information showing the shape that each component 200 has in the brand new state. Here, where there are a plurality of types of components 200, the damage position information becomes information that correlates identification information indicating the types of components 200 with damage positions on the respective components 200. Further, the component design information becomes information that correlates identification information indicating the types of components 200 with the shapes of the respective components 200.

With respect to each component 200, the controller 172 obtains the corresponding damage position information from the storage 171. Then, the controller 172 controls the position of the coating part 130 relative to the component 200 and the amount of restoration liquid to be supplied from the restoration liquid storage part 120, to apply the restoration liquid onto the damage position on the component by a predetermined amount. Where there are a plurality of types of components 200, the controller 172 obtains the damage position information corresponding to the identification information of a component 200 placed on the stage 110, from the storage 171, and then performs control on the basis of the damage position information thus obtained.

Further, when solidifying the restoration liquid by heat, the controller 172 increases the temperature from the component 200 side. The controller 172 stops the temperature increase at a temperature lower than the solidification temperature of the restoration liquid, and maintains this temperature for a predetermined time. The predetermined time for maintaining this temperature is from ten seconds to ten minutes, for example. After the predetermined time has elapsed, the controller 172 performs temperature increase to increase the temperature gradually to a temperature higher than the solidification temperature of the restoration liquid. Thereafter, the controller 172 stops the temperature increase, and maintains this temperature for a predetermined time. The predetermined time for maintaining this temperature is from ten seconds to ten minutes, for example. Here, where lamp heating is used, the controller 172 performs heating by selecting a wavelength that can be easily absorbed not by the restoration liquid but by the component 200. When the heating is performed in this way, solidification of the restoration liquid is developed from the interface with the component 200, so that the strain inside the solidified and restored portion becomes smaller. As a result, the restored portion becomes less likely to peel off from the component 200.

On the other hand, when solidifying the restoration liquid by light, the controller 172 selects light having a wavelength longer than that of the absorption edge of the restoration liquid, and thereby controls irradiation for the component 200. When light having such a wavelength is used, although solidification of the restoration liquid is developed from the surface irradiated with light, the solidify speed is low, so that the strain inside the solidified and restored portion becomes smaller.

For the processing in the additional processing section 150, as in the ordinary lathe turning machine or machining center, the controller 172 obtains the component design information corresponding to the identification information of the component 200, from the storage 171, and then conducts additional processing to the component 200 in accordance with the component design information thus obtained.

Figure 5:
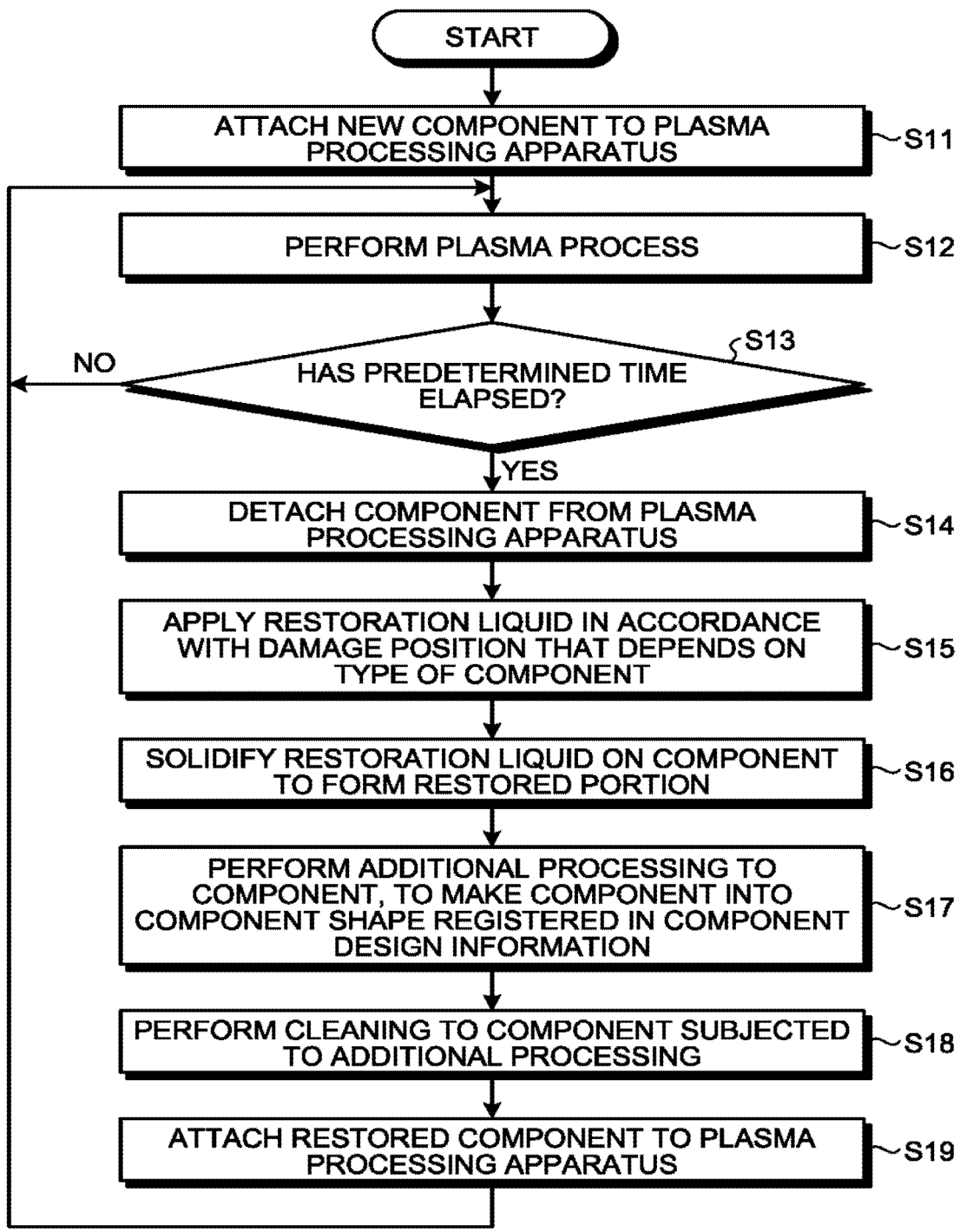
FIG. 5 is a flowchart illustrating an example of the sequence of a component restoration method according to the first embodiment.

Next, an explanation will be given of a component restoration method in the restoration apparatus 101 described above. FIG. 5 is a flowchart illustrating an example of the sequence of a component restoration method according to the first embodiment. First, an unused component in the brand new state is attached to the plasma processing apparatus 10 (step S11), and then a plasma process is performed (step S12). Thereafter, it is determined whether the plasma process has been performed for a predetermined time since the component was attached to the plasma processing apparatus 10 (step S13). When the plasma process has not yet been performed for the predetermined time (No at step S13), a waiting state follows, and the processing sequence returns to step S12. On the other hand, when the plasma process has been performed for the predetermined time (Yes at step S13), the component is detached from the plasma processing apparatus 10 (step S14).

Then, the component is transferred to the restoration apparatus 101, and is placed on the stage 110. Thereafter, the controller 172 obtains the damage position information corresponding to the type of the component, from the storage 171. Then, the restoration liquid is applied from the coating part 130 onto the component, in accordance with this damage position information (step S15). For example, in order to apply the restoration liquid by a predetermined amount onto the damage position prescribed in the damage position information, the positions of the component and the coating part 130 and the application amount of the restoration liquid are controlled.

Then, under the control of the controller 172, the solidifying part 140 solidifies the restoration liquid on the component to form a restored portion (step S16). The solidification of the restoration liquid is performed, for example, by heating the restoration liquid on the component, or by irradiating the restoration liquid on the component with light having a predetermined wavelength. By the solidification of the restoration liquid, the consumed region on the component is provided with the restored portion. At this time, where a heater embedded in the stage 110 is used as the solidifying part 140, the controller 172 controls the heater. For example, the controller 172 controls the heater, as follows: The heater stops temperature increase at a temperature lower than the solidification temperature of the restoration liquid; maintains this temperature for ten seconds to ten minutes, for example; thereafter, stops temperature increase at a temperature higher than the solidification temperature of the restoration liquid; and maintains this temperature for ten seconds to ten minutes, for example. Alternatively, where lamp heating is used for the solidifying part 140, the controller 172 selects a wavelength that can be easily absorbed not by the restoration liquid but by the component, and performs control to irradiate the component by the heating. Alternatively, where a light source is used as the solidifying part 140, the controller 172 selects light having a wavelength longer than that of the absorption edge of the restoration liquid, and performs control to irradiate the component with the light.

Thereafter, under the control of the controller 172, the additional processing section 150 performs additional processing to the component including the restored portion formed thereon, to make the component into the component shape registered in the component design information (step S17). For example, the additional processing section 150 performs an additional processing treatment, such as grinding, polishing, or the like to a place protruding from the surrounding surface. After the additional processing treatment, under the control of the controller 172, the cleaning section 160 performs cleaning to the component subjected to the additional processing (step S18). Consequently, the component is restored.

Then, the restored component is attached to the plasma processing apparatus 10 again, and is reused (step S19). Thereafter, the processing sequence returns to step S12.

It should be noted that the restored portion may be made of a material the same as that of the component, or a material different from that of the component. For example, in the case of an edge ring made of SiC, the restored portion may be made of SiC, or may be made of $SiO_2$. Further, in the case of an insulator ring 23 made of $SiO_2$, the restored portion may be made of $SiO_2$, or may be made of SiC.

Further, before the restoration liquid is applied in step S15, the component may be heated. For example, the conditions for this heating may include a temperature from one hundred to several hundred degrees ° C., and a time from five to thirty minutes. The method for this heating may be selected from various methods, such as heating by a heater, and lamp heating. Consequently, moisture at the interface of the component is removed. Further, when the component is reused in step S19, if the shape of the component is horizontally symmetric and vertically symmetric, as in the edge ring 22, the surface of the component with the restored portion formed thereon may be oriented upward, or may be oriented downward, in placement of the component. For example, where the restored portion is made of SiC, the surface with the restored portion formed thereon may be oriented upward, or may be oriented downward. However, where the restored portion is made of $SiO_2$, the surface with the restored portion formed thereon is preferably oriented downward.

As described above, in the first embodiment, the restoration liquid is applied onto the consumed region on a component for use in the plasma processing apparatus 10, and is then solidified, to restore the component. Consequently, an effect is provided to make it possible to attach the component to the plasma processing apparatus 10 again, and to reuse the component.

Second Embodiment

In the first embodiment, an explanation has been given of a restoration apparatus and a restoration method for a plasma processing apparatus on the premise that the damage position on a component is almost constant for every type of component. In the second embodiment, an explanation will be given of a case where restoration of a component is performed by confirming a damage position on each component to be restored.

Figure 6:
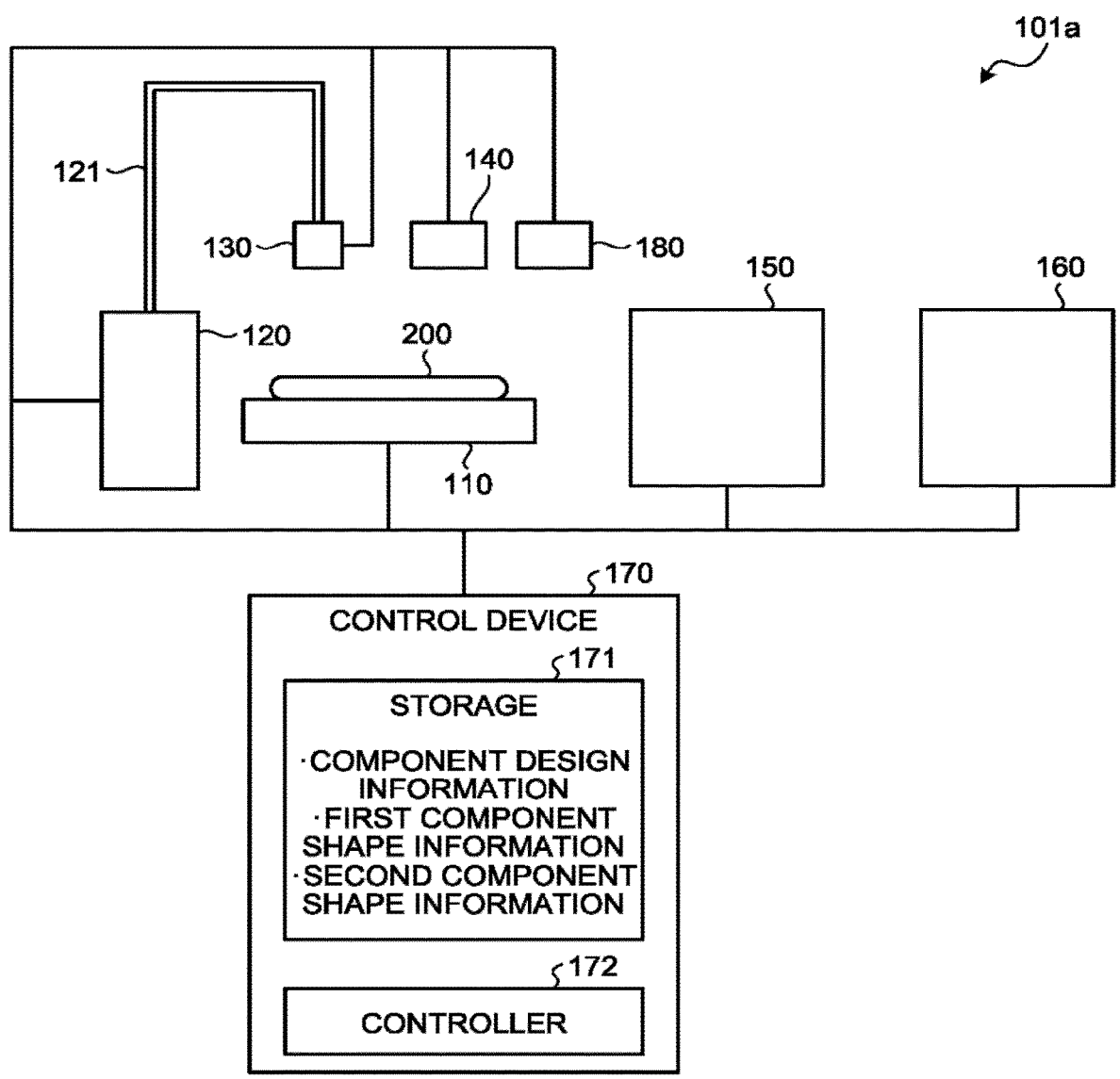
FIG. 6 is a diagram schematically illustrating a configuration example of a restoration apparatus for a plasma processing apparatus, according to a second embodiment.

FIG. 6 is a diagram schematically illustrating a configuration example of a restoration apparatus for a plasma processing apparatus, according to the second embodiment. The restoration apparatus 101a includes a component shape acquiring part 180 for acquiring the shape of a component 200, in addition to the configuration according to the first embodiment. The component shape acquiring part 180 is configured to acquire the shape of a component 200 in the brand new state and the shape of the component 200 in a damaged state, and to sore these shapes into a storage 171 of the control device 170. For example, the component shape acquiring part 180 is formed of an image pickup device, such as camera. In this case, information about the shape of each component 200 is image data. For example, this image data is a picked-up image of a surface of the component 200, which is exposed during a plasma process.

Here, the control device 170 includes the storage 171 and a controller 172. The storage 171 stores component design information, first component shape information, and second component shape information. The component design information is substantially the same as that described in the first embodiment. The first component shape information contains identification information indicating the type of each component, for example, and shape data about the component 200 in the brand new state. The second component shape information contains identification information indicating the type of each component, for example, and shape data about the component 200 after use in the plasma process.

The controller 172 includes a function to acquire the position of a consumed region on a component, in addition to the function to control the restoration apparatus 101a as a whole as described in the first embodiment. Specifically, when the second component shape information is acquired by the component shape acquiring part 180, the controller 172 compares this second component shape information with the first component shape information of the corresponding component, and acquires the position of a consumed region. For example, where each of the first component shape information and the second component shape information is image data, the position of the edge of the component 200 is acquired, and the difference of the edge in the second component shape information, with respect to the edge in the first component shape information, is regarded as the consumed region. Further, the position of the consumed region is superimposed onto the first component shape information so that the position of the consumed region on the component 200 can be specified. When applying the restoration liquid, the controller 172 applies the restoration liquid on the basis of this position of the consumed region. Here, the constituent elements corresponding to those described in the first embodiment are denoted by the same reference symbols, and their description will be omitted.

Figure 7:
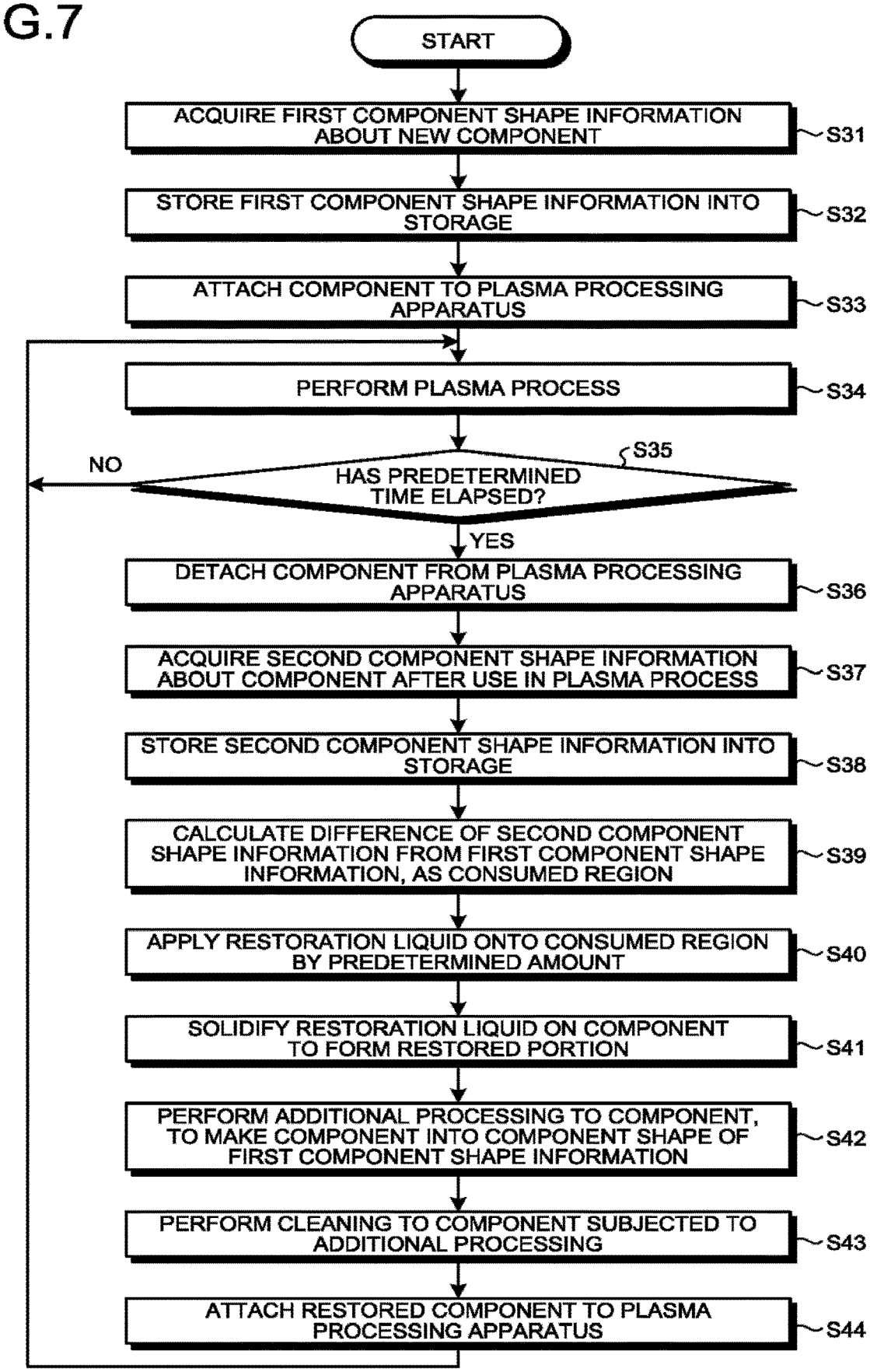
FIG. 7 is a flowchart illustrating an example of the sequence of a component restoration method according to the second embodiment.

Next, an explanation will be given of a component restoration method in the restoration apparatus 101a described above. FIG. 7 is a flowchart illustrating an example of the sequence of a component restoration method according to the second embodiment. First, an unused component, i.e., a component in the brand new state is placed on the stage 110 of the restoration apparatus 101a, and its shape data, i.e., first component shape information is acquired by the component shape acquiring part 180 (step S31). The first component shape information thus acquired is stored into the storage 171 (step S32).

Thereafter, the processing sequence is executed in substantially the same way as that of steps S11 to S14 in FIG. 5 according to the first embodiment (steps S33 to S36). Specifically, the component is attached to the plasma processing apparatus 10, and then a plasma process is performed. Thereafter, when the plasma process has been performed for a predetermined time since the component was attached to the plasma processing apparatus 10, the component is detached from the plasma processing apparatus 10.

Then, the component after use in the plasma process is placed on the stage 110 of the restoration apparatus 101a, and its shape, i.e., second component shape information is acquired by the component shape acquiring part 180 (step S37). The second component shape information thus acquired is stored into the storage 171 (step S38). Thereafter, the controller 172 reads the first component shape information and the second component shape information from the storage 171, and calculates the difference of the second component shape information from the first component shape information, as a consumed region (step S39).

Then, under the control of the controller 172, the coating part 130 applies the restoration liquid by a predetermined amount onto the consumed region thus calculated (step S40). Thereafter, the processing sequence is executed in substantially the same way as that of steps S16 to S19 in FIG. 5 according to the first embodiment (steps S41 to S44). Specifically, the solidifying part 140 solidifies the restoration liquid on the component. The additional processing section 150 performs additional processing to the component, to make the component into the component shape registered in the component design information. The cleaning section 160 performs cleaning to the component subjected to the additional processing. Then, the restored component is attached to the plasma processing apparatus 10 again, and is reused. Thereafter, the processing sequence returns to step S34.

As described above, in the second embodiment, the first component shape information about a component in the brand new state and the second component shape information about the component after use in a plasma process are compared with each other, to acquire the position of a consumed region. Then, the restoration liquid is applied onto the component, on the basis of this position of the consumed region. Consequently, the restoration liquid is not applied onto a non-consumed region, and thus the consumption amount of the restoration liquid can be smaller, as compared with the first embodiment.

Third Embodiment

In the second embodiment, it has been assumed that each of the first component shape information and the second component shape information is image data. Accordingly, when these two pieces of information are compared with each other, the position of a consumed region can be acquired, but the depth of the consumed region illustrated in FIG. 2, for example, cannot be acquired. In the third embodiment, an explanation will be given of a restoration apparatus and a restoration method for a plasma processing apparatus, which can acquire information further containing the depth of a consumed region.

A restoration apparatus 101a for a plasma processing apparatus according to the third embodiment has a configuration substantially the same as that illustrated in FIG. 6 according to the second embodiment. However, the component shape acquiring part 180 is configured to acquire, as shape data about a component, the state of depressions and/or protrusions on at least a surface of the component, which is exposed during a plasma process. The component shape acquiring part 180 of this type may be exemplified by a three-dimensional measuring instrument.

Accordingly, the controller 172 can acquire a consumed region from the difference between the first component shape information and the second component shape information. Here, information about this consumed region contains not only the position of the consumed region within the planar positions of the component, but also the depth of the consumed region at each of the planar positions. Then, when applying the restoration liquid onto the consumed region, the controller 172 controls the coating part 130 and the restoration liquid storage part 120 to change the application amount of the restoration liquid in accordance with the depth of the consumed region at the application position. Here, the other parts of the configuration are substantially the same as those described in the first and second embodiments.

Figure 8:
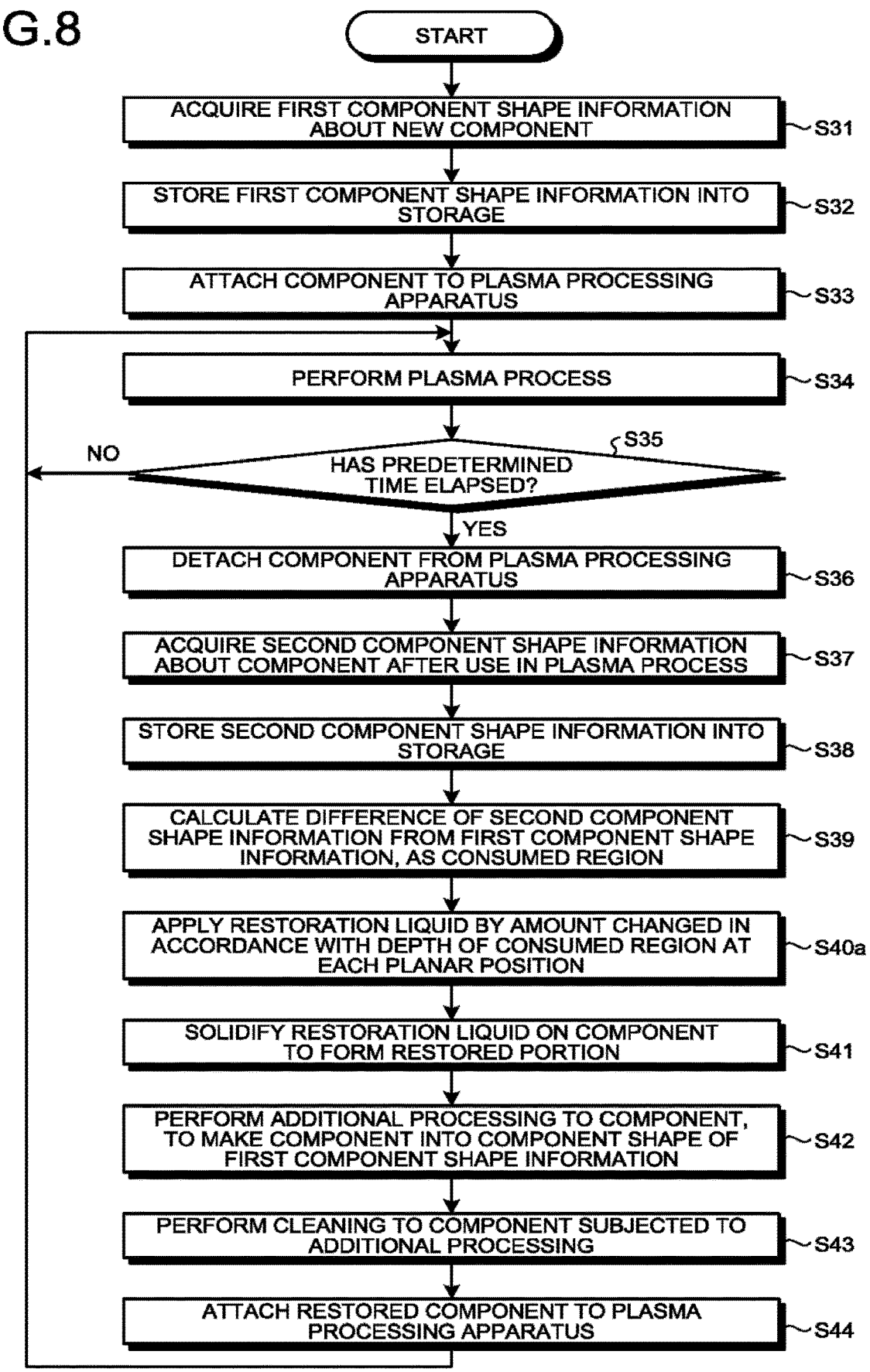
FIG. 8 is a flowchart illustrating an example of the sequence of a component restoration method according to a third embodiment.

Next, an explanation will be given of a restoration method in the restoration apparatus 101a for a plasma processing apparatus described above. FIG. 8 is a flowchart illustrating an example of the sequence of a component restoration method according to the third embodiment. This flowchart is basically almost the same as that described with reference to FIG. 7 according to the second embodiment, but is different at step S40 in FIG. 7. Specifically, in the third embodiment, as illustrated in FIG. 8, under the control of the controller 172, the coating part 130 applies the restoration liquid onto a component by a certain amount, while changing this certain amount in accordance with the depth of the consumed region at each planar position (step S40a). The other steps are substantially the same as those of FIG. 7, and thus their description will be omitted.

In the third embodiment, the application amount of the restoration liquid is adjusted in accordance with the depth of the consumed region at each planar position. Consequently, it is possible to apply the restoration liquid by a suitable amount in accordance with the shape of the consumed region. As a result, the consumption amount of the restoration liquid can be smaller, as compared with the second embodiment.

Figure 9:
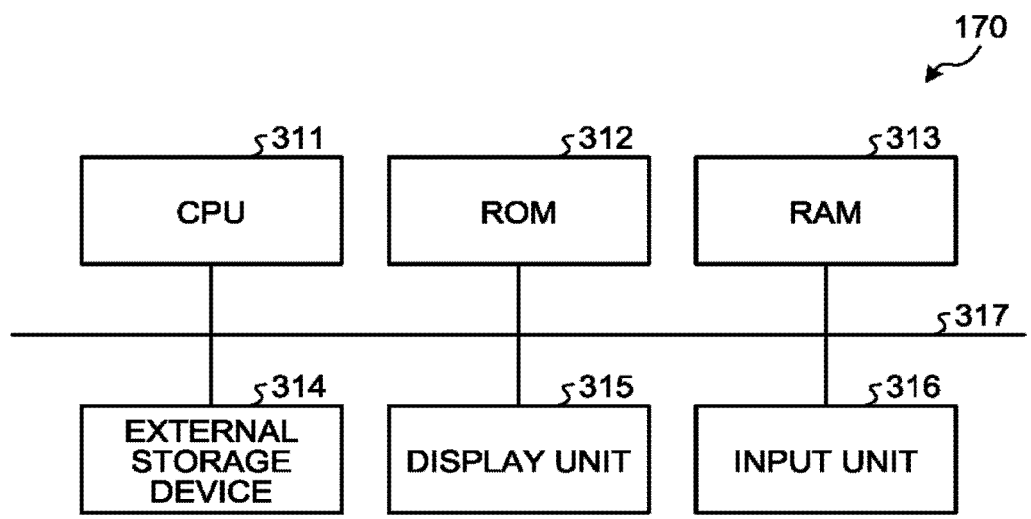
FIG. 9 is a diagram illustrating a hardware configuration example of a control device.

FIG. 9 is a diagram illustrating a hardware configuration example of the control device. The control device 170 has a hardware configuration utilizing an ordinary computer, in which a Central Processing Unit (CPU) 311, a Read Only Memory (ROM) 312, a Random Access Memory (RAM) 313 serving as the main storage device, an external storage device 314, such as a Hard Disk Drive (HDD), Solid State Drive (SSD), or Compact Disc (CD) drive device, a display unit 315, such as a display device, and an input unit 316, such as a keyboard and/or a mouse, are included, and are connected to each other via a bus line 317.

A program to be executed by the control device 170 according to the embodiment has been prepared to perform the method illustrated in FIG. 5, 7, or 8. This program is provided in a state recorded in a computer-readable recording medium, such as a CD-ROM, flexible disk (FD), CD-R, or Digital Versatile Disk (DVD), by a file in an installable format or executable format.

Alternatively, a program to be executed by the control device 170 according to the embodiment may be provided such that the program is stored in a computer connected to a network, such as the internet, and is downloaded via the network. Further, a program to be executed by the control device 170 according to the embodiment may be provided such that the program is provided or distributed via a network, such as the internet.

Alternatively, a program according to the embodiment may be provided in a state incorporated in a ROM or the like in advance.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A restoration method for a plasma processing apparatus, the method comprising:
   acquiring first component shape information about a shape of a component in a brand new state, the component serving as a constituent element of the plasma processing apparatus, and second component shape information about a shape of the component after use in a plasma process;
   acquiring a consumed region of the component from a difference between the first component shape information and the second component shape information;
   performing an application of a restoration liquid from a coating part onto the consumed region on the component by controlling positions of the component and the coating part, and an application amount of the restoration liquid in accordance with the consumed region; and
   solidifying the restoration liquid applied on the component.

2. The restoration method for a plasma processing apparatus according to claim 1, wherein the first component shape information and the second component shape information include image data picked up by a camera, and
   the consumed region is acquired from a difference between the first component shape information and the second component shape information.

3. The restoration method for a plasma processing apparatus according to claim 2, wherein, in performing the application of the restoration liquid, an application amount of the restoration liquid is a same amount for all positions on the component.

4. The restoration method for a plasma processing apparatus according to claim 1, wherein
   the first component shape information and the second component shape information include information about a depression or protrusion on the component acquired by a three-dimensional measuring instrument,
   the consumed region is acquired from a difference between the first component shape information and the second component shape information, and
   an application amount of the restoration liquid is changed in accordance with a depth of the consumed region at each position on the component.

5. The restoration method for a plasma processing apparatus according to claim 1, wherein the restoration liquid contains liquid SiC or SOG solution.

* * * * *